(12) United States Patent
Wan

(10) Patent No.: US 12,243,597 B2
(45) Date of Patent: Mar. 4, 2025

(54) MEMORY DEVICE AND PROGRAM OPERATION THEREOF

(71) Applicant: YANGTZE MEMORY TECHNOLOGIES CO., LTD., Wuhan (CN)

(72) Inventor: Weijun Wan, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 147 days.

(21) Appl. No.: 18/132,802

(22) Filed: Apr. 10, 2023

(65) Prior Publication Data

US 2024/0221848 A1 Jul. 4, 2024

Related U.S. Application Data

(63) Continuation of application No. PCT/CN2023/083669, filed on Mar. 24, 2023.
(Continued)

(51) Int. Cl.
*G11C 16/08* (2006.01)
*G11C 16/10* (2006.01)
(Continued)

(52) U.S. Cl.
CPC .......... *G11C 16/3459* (2013.01); *G11C 16/08* (2013.01); *G11C 16/102* (2013.01);
(Continued)

(58) Field of Classification Search
CPC ... G11C 16/3459; G11C 16/08; G11C 16/102; G11C 11/5628; G11C 16/0483; G11C 16/10
(Continued)

(56) References Cited

U.S. PATENT DOCUMENTS 10,943,665 B1 * 3/2021 Zhao ................... G11C 11/5628
2019/0267107 A1 8/2019 Joe
(Continued)

FOREIGN PATENT DOCUMENTS

| CN | 106448733 A | 2/2017 |
|---|---|---|
| CN | 111667871 A | 9/2020 |
| CN | 115019861 A | 9/2022 |

OTHER PUBLICATIONS

International Search Report issued in corresponding International Application No. PCT/CN2023/083669, mailed Sep. 12, 2023, 3 pages.

*Primary Examiner* — Ly D Pham
(74) *Attorney, Agent, or Firm* — BAYES PLLC

(57) ABSTRACT

In certain aspects, a memory device includes an array of memory cells and a peripheral circuit coupled to the array of memory cells. At least one of the memory cells is set to one of $2^N$ levels corresponding to a piece of N-bits data, where N is an integer greater than 1. The peripheral circuit is configured to apply a first program voltage to a select row of the memory cells, perform a first verification of the select row of the memory cells at a last level of the $2^N$ levels after applying the first program voltage, perform a first verify fail count (VFC) based on a result of the first verification and a first VFC criterion, apply a second program voltage greater than the first program voltage to the select row of the memory cells after performing the first VFC, and perform a second VFC based on the result of the first verification and a second VFC criterion different from the first VFC criterion within a period of applying the second program voltage.

20 Claims, 13 Drawing Sheets

Related U.S. Application Data

(60) Provisional application No. 63/436,441, filed on Dec. 30, 2022.

(51) Int. Cl.
*G11C 16/34* (2006.01)
*G11C 11/56* (2006.01)
*G11C 16/04* (2006.01)

(52) U.S. Cl.
CPC ...... *G11C 11/5628* (2013.01); *G11C 16/0483* (2013.01); *G11C 16/10* (2013.01)

(58) Field of Classification Search
USPC ................................................ 365/185.22
See application file for complete search history.

(56) References Cited

U.S. PATENT DOCUMENTS

| | | | |
|---|---|---|---|
| 2021/0407606 A1* | 12/2021 | Choi | G11C 11/5628 |
| 2022/0301626 A1* | 9/2022 | Liang | G11C 16/0483 |
| 2023/0154553 A1* | 5/2023 | Lee | G11C 16/24 |
| | | | 365/185.22 |
| 2024/0143181 A1* | 5/2024 | Deng | G11C 16/0483 |

\* cited by examiner

MEMORY DEVICE AND PROGRAM OPERATION THEREOF

CROSS-REFERENCE TO RELATED APPLICATIONS

This application is a continuation of Internal Application No. PCT/CN2023/083669, filed Mar. 24, 2023, entitled "MEMORY DEVICE AND PROGRAM OPERATION THEREOF," which claims the benefit of priority to U.S. Provisional Application No. 63/436,441, filed on Dec. 30, 2022, both of which are hereby incorporated by reference in their entireties.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase. For NAND Flash memory, an erase operation can be performed at the block level, and a program operation or a read operation can be performed at the page level.

SUMMARY

In one aspect, a memory device includes an array of memory cells and a peripheral circuit coupled to the array of memory cells. At least one of the memory cells is set to one of $2^N$ levels corresponding to a piece of N-bits data, where N is an integer greater than 1. The peripheral circuit is configured to apply a first program voltage to a select row of the memory cells, and perform a first verification of the select row of the memory cells at a last level of the $2^N$ levels after applying the first program voltage. The peripheral circuit is also configured to perform a first verify fail count (VFC) based on a result of the first verification and a first VFC criterion. The peripheral circuit is further configured to apply a second program voltage greater than the first program voltage to the select row of the memory cells after performing the first VFC, and perform a second VFC based on the result of the first verification and a second VFC criterion different from the first VFC criterion within a period of applying the second program voltage.

In some implementations, the peripheral circuit is configured to apply the second program voltage in response to the result of the first verification not meeting the first VFC criterion.

In some implementations, the peripheral circuit is further configured to in response to the result of the first verification not meeting the second VFC criterion, perform a second verification of the select row of the memory cells at the last level, and perform a third VFC based on a result of the second verification and a third VFC criterion.

In some implementations, the peripheral circuit is further configured to in response to the result of the first verification meeting the second VFC criterion, skip the second verification and the third VFC.

In some implementations, the third VFC criterion is the same as the first VFC criterion.

In some implementations, the memory device further includes word lines respectively coupled to rows of the memory cells. In some implementations, to perform the first verification, the peripheral circuit includes a word line driver configured to apply a verify voltage to a select word line of the word lines that is coupled to the select row of the memory cells, the verify voltage corresponding to the last level of the $2^N$ levels.

In some implementations, to perform the first VFC, the peripheral circuit includes a page buffer configured to obtain a number of failed memory cells of the select row of the memory cells that fail to pass the first verification, and control logic configured to compare the number of the failed memory cells against the first VFC criterion.

In some implementations, the second VFC criterion is less strict than the first VFC criterion.

In another aspect, a system includes a memory device configured to store data and a memory controller coupled to the memory device and configured to control the memory device. The memory device includes an array of memory cells and a peripheral circuit coupled to the array of memory cells. At least one of the memory cells is set to one of $2^N$ levels corresponding to a piece of N-bits data, where N is an integer greater than 1. The peripheral circuit is configured to apply a first program voltage to a select row of the memory cells, and perform a first verification of the select row of the memory cells at a last level of the $2^N$ levels after applying the first program voltage. The peripheral circuit is also configured to perform a first VFC based on a result of the first verification and a first VFC criterion. The peripheral circuit is further configured to in response to the result of the first verification not meeting the first VFC criterion, apply a second program voltage greater than the first program voltage to the select row of the memory cells after performing the first VFC, and perform a second VFC based on the result of the first verification and a second VFC criterion different from the first VFC criterion within a period of applying the second program voltage.

In some implementations, the peripheral circuit is further configured to in response to the result of the first verification not meeting the second VFC criterion, perform a second verification of the select row of the memory cells at the last level, and perform a third VFC based on a result of the second verification and a third VFC criterion.

In some implementations, the peripheral circuit is further configured to in response to the result of the first verification meeting the second VFC criterion, skip the second verification and the third VFC.

In some implementations, the third VFC criterion is the same as the first VFC criterion.

In some implementations, to perform the first VFC, the peripheral circuit includes a page buffer configured to obtain a number of failed memory cells of the select row of the memory cells that fail to pass the first verification, and control logic configured to compare the number of the failed memory cells against the first VFC criterion.

In some implementations, the second VFC criterion is less strict than the first VFC criterion.

In still another aspect, a method for programming a memory device is provided. The memory device includes rows of memory cells. At least one of the memory cells is set to one of $2^N$ levels corresponding to a piece of N-bits data, where N is an integer greater than 1. A first program voltage is applied to a select row of the rows of the memory cells. A first verification of the select row is performed at a last level of the $2^N$ levels after applying the first program voltage. A first VFC is performed based on a result of the first verification and a first VFC criterion. A second program voltage greater than the first program voltage is applied to the select row after performing the first VFC. A second VFC is performed based on the result of the first verification and a second VFC criterion different from the first VFC criterion within a period of applying the second program voltage.

In some implementations, the second program voltage is applied in response to the result of the first verification not meeting the first VFC criterion.

In some implementations, in response to the result of the first verification not meeting the second VFC criterion, a second verification of the select row is performed at the last level, and a third VFC is performed based on a result of the second verification and a third VFC criterion.

In some implementations, in response to the result of the first verification meeting the second VFC criterion, the second verification and the third VFC are skipped.

In some implementations, the third VFC criterion is the same as the first VFC criterion.

In some implementations, to perform the first verification, a verify voltage corresponding to the last level of the $2^N$ levels is applied to the select row.

In some implementations, to perform the first VFC, a number of failed memory cells of the select row that fail to pass the first verification is obtained, and the number of the failed memory cells is compared against the first VFC criterion.

In some implementations, the second VFC criterion is less strict than the first VFC criterion.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
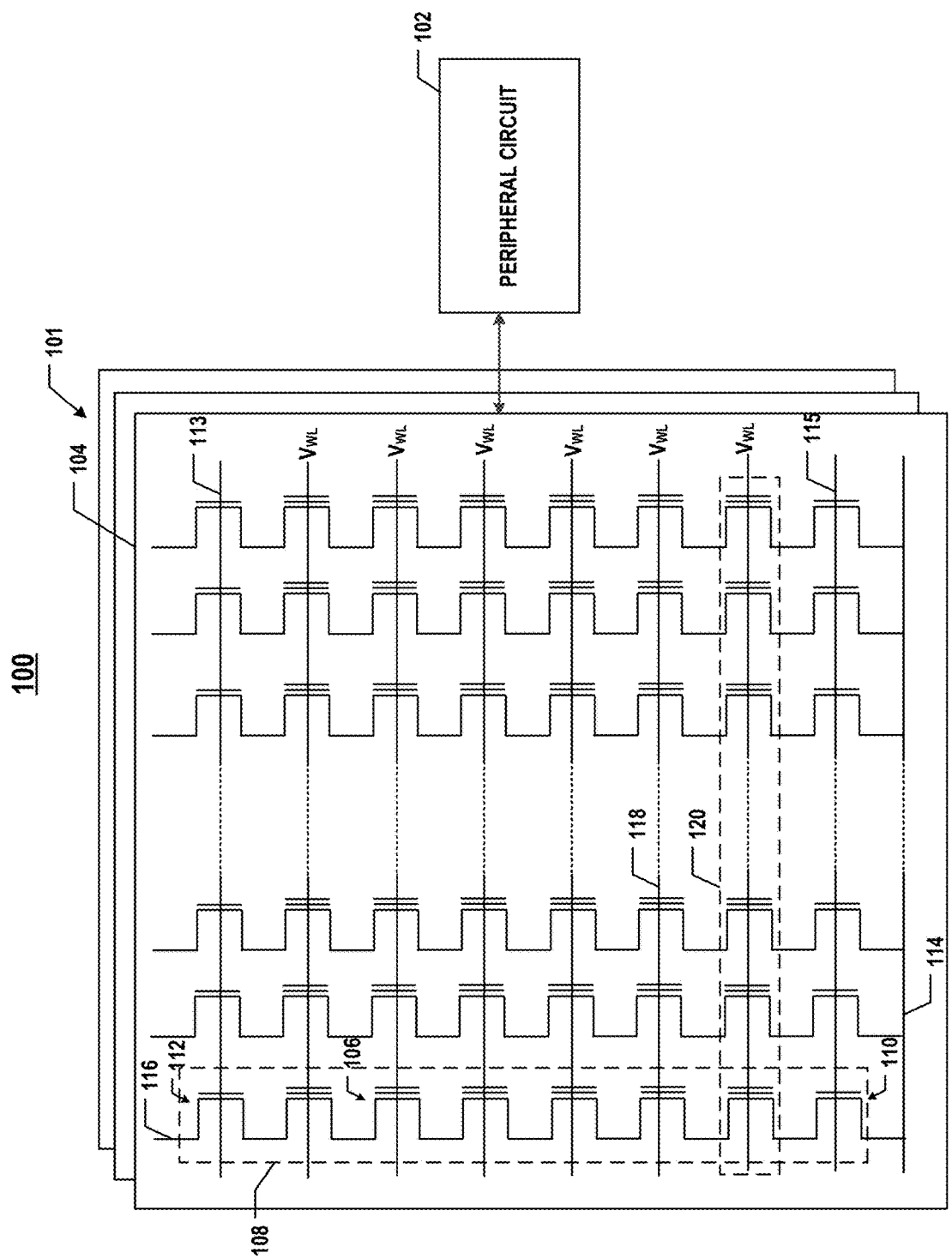
FIG. 1 illustrates a schematic diagram of a memory device including peripheral circuits, according to some aspects of the present disclosure.

The present disclosure will be described with reference to the accompanying drawings.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Memory devices, such as NAND Flash memory devices, can store more than a single bit of information into each memory cell with multiple states in order to increase the storage capacity and reduce the cost per bit. In program operations, the data may be first programmed (written) into single-level cell (SLC) blocks and later combined into xLC blocks, such as multi-level cell (MLC) blocks, trip-level cell (TLC) blocks, quad-level cell (QLC) blocks, etc., in order to save program time ($t_{PROG}$). The program operation of a NAND Flash memory device involves a number of program cycles and verify cycles, and can end after either the program cycle or the verify cycle depending on the specific last-level VFC scheme employed by the program operation. Thus, the program time of a program operation can be affected by its last-level VFC scheme, which determines the timing when the program operation ends. Some last-level VFC schemes (a.k.a., normal last-level VFC schemes) always perform the last-level VFC after a verify cycle to end the program operation. To save the program time, some last-level VFC schemes (a.k.a., predictive last-level VFC schemes) may skip the last verify cycle and end the program operation after the program cycle by performing the last-level VFC within the program cycle using a predictive VFC criterion that is less strict than the normal VFC criterion (e.g., having a higher fail bits threshold), which predicts whether the next program cycle is the last program cycle of the program operation.

On the other hand, there is a limitation of the largest number of fail bits that can be counted by the peripheral circuits of the memory devices (VFC). Due to the VFC capability and/or the word line-to-word line variation, the predictive last-level VFC schemes can skip the last verify cycle and thereby reducing the program time only when its VFC capability is sufficient to cover the memory cells that have passed the last verification. Otherwise, an extra program/verify cycle becomes needed in the program operation, which in fact, increases the program time.

To address one or more of the aforementioned issues, the present disclosure introduces an adaptive last-level VFC scheme that can adaptively switch between a normal last-level VFC scheme and a predictive last-level VFC scheme based on the VFC capabilities of the peripheral circuits. If the VFC capability is sufficient to cover the memory cells that have passed the last verification, the adaptive last-level VFC scheme is able to skip the last verify cycle and end the program operation after the program cycle by performing the last-level VFC within the program cycle using a predictive VFC criterion; if the VFC capability is not sufficient to cover the memory cells that have passed the last verification, the adaptive last-level VFC scheme is able to perform the last-level VFC after a verify cycle to end the program operation, thereby avoiding introducing an extra program/verify cycle to the program operation. In some implementations, the last-level VFC is performed after the verify cycle using the normal VFC criterion, as well as performed within the program cycle using the predictive VFC criterion, such that the program operation can end either after the verify cycle or after the program cycle. That is, the timing when the program operation ends can be adaptive to the VFC capability and word-line-to-word line variation. As a result, the average program time across different word lines using the adaptive last-level VFC scheme disclosed herein can be shortened compared with either the normal last-level VFC schemes or the predictive last-level VFC schemes.

FIG. 1 illustrates a schematic circuit diagram of a memory device 100 including peripheral circuits, according to some aspects of the present disclosure. Memory device 100 can include a memory cell array 101 and peripheral circuits 102 coupled to memory cell array 101. Memory cell array 101 can be a NAND Flash memory cell array in which memory cells 106 are provided in the form of an array of NAND memory strings 108 each extending vertically above a substrate (not shown). In some implementations, each NAND memory string 108 includes a plurality of memory cells 106 coupled in series and stacked vertically. Each memory cell 106 can hold a continuous, analog value, such as an electrical voltage or charge, which depends on the number of electrons trapped within a region of memory cell 106. Each memory cell 106 can be either a floating gate type of memory cell including a floating-gate transistor or a charge trap type of memory cell including a charge-trap transistor.

In some implementations, each memory cell 106 is an SLC that has two possible levels (memory states) and thus, can store one bit of data. For example, the first level "0" can correspond to a first range of threshold voltages, and the second level "1" can correspond to a second range of threshold voltages. In some implementations, each memory cell 106 is an xLC that is capable of storing more than a single bit of data in more than four levels. For example, the xLC may store two bits per cell (MLC), three bits per cell (TLC), or four bits per cell (QLC)). Each xLC can be programmed to assume a range of possible nominal storage values (i.e., corresponding to 2 pieces of N-bits data). In some implementations, at least one of memory cells 106 is set to one of $2^N$ levels corresponding to a piece of N-bits data, where N is an integer greater than 1.

As shown in FIG. 1, each NAND memory string 108 can also include a source select gate (SSG) transistor 110 at its source end and a drain select gate (DSG) transistor 112 at its drain end. SSG transistor 110 and DSG transistor 112 can be configured to activate select NAND memory strings 108 (columns of the array) during read and program operations. In some implementations, the sources of NAND memory strings 108 in the same block 104 are coupled through a same source line (SL) 114, e.g., a common SL. In other words, all NAND memory strings 108 in the same block 104 have an array common source (ACS), according to some implementations. The drain of each NAND memory string 108 is coupled to a respective bit line 116 from which data can be read or written via an output bus (not shown), according to some implementations. In some implementations, each NAND memory string 108 is configured to be selected or deselected by applying a select voltage or a deselect voltage to the gate of respective DSG transistor 112 through one or more DSG lines 113 and/or by applying a select voltage or a deselect voltage to the gate of respective SSG transistor 110 through one or more SSG lines 115.

As shown in FIG. 1, NAND memory strings 108 can be organized into multiple blocks 104, each of which can have a common source line 114, e.g., coupled to the ACS. In some implementations, each block 104 is the basic data unit for erase operations, i.e., all memory cells 106 on the same block 104 are erased at the same time. To erase memory cells 106 in a select block 104, source lines 114 coupled to select block 104 as well as unselect blocks 104 in the same plane as select block 104 can be biased with an erase voltage (Vers), such as a high positive bias voltage (e.g., 20 V or more). Memory cells 106 of adjacent NAND memory strings 108 can be coupled through word lines 118 that select which row of memory cells 106 is affected by read and program operations. In some implementations, each word line 118 is coupled to a page 120 of memory cells 106, which is the basic data unit for read and program operations. The size of one page 120 in bits can relate to the number of NAND memory strings 108 coupled by word line 118 in one block 104. Each word line 118 can include a plurality of control gates (gate electrodes) at each memory cell 106 in respective page 120 and a gate line coupling the control gates.

As shown in FIG. 1, memory cell array 101 can include an array of memory cells 106 in a plurality of rows and a plurality of columns in each block 104. One row of memory cells 106 corresponds to one or more pages 120, and one column of memory cells corresponds to one NAND memory string 108, according to some implementations. The plurality of rows of memory cells 106 can be respectively coupled to word lines 118, and the plurality of columns of memory cells 106 can be respectively coupled to bit lines 116. Peripheral circuit 102 can be coupled to memory cell array 101 through bit lines 116 and word lines 118.

Figure 2:
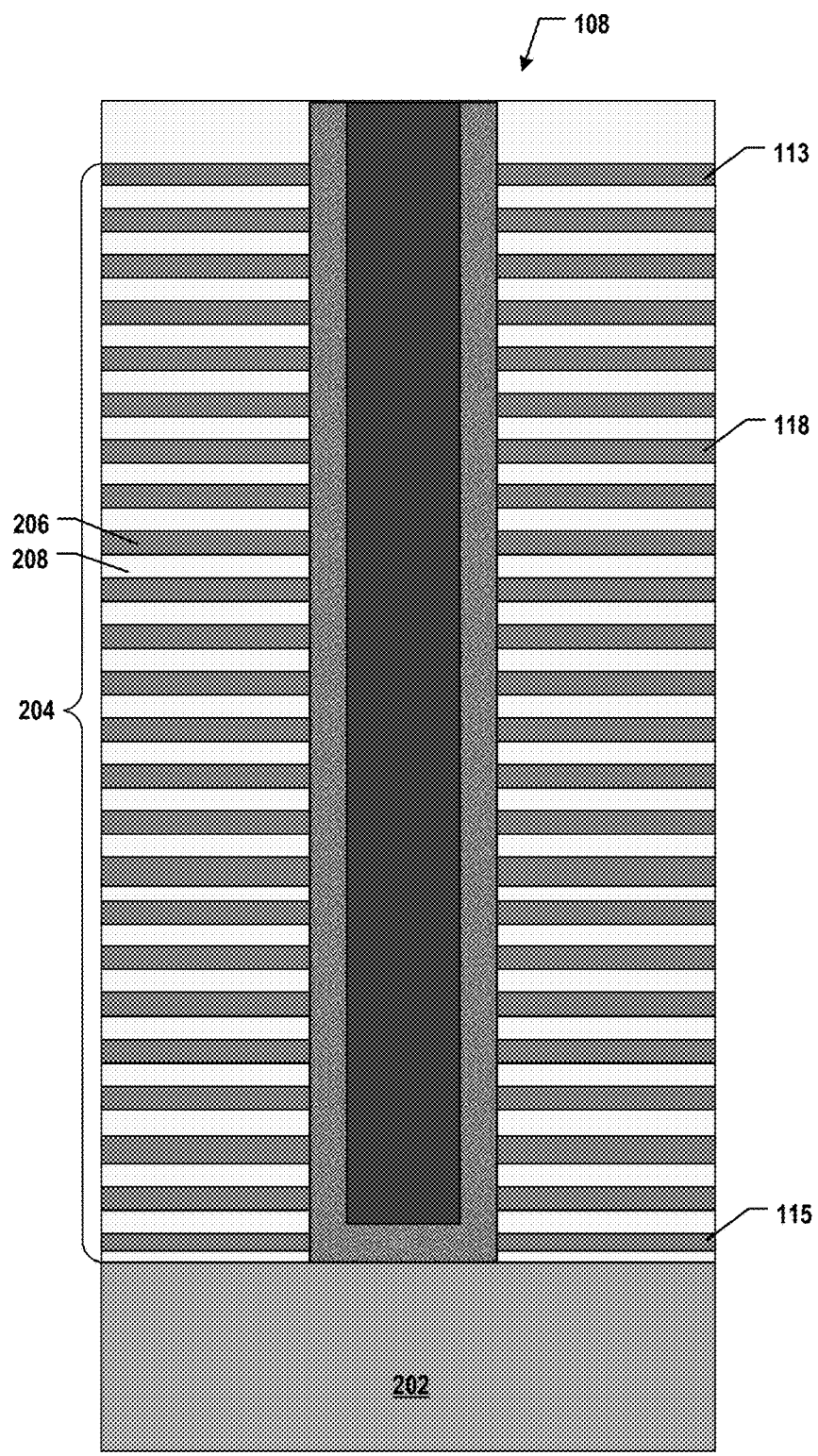
FIG. 2 illustrates a side view of a cross-section of a memory cell array including a NAND memory string, according to some aspects of the present disclosure.

FIG. 2 illustrates a side view of a cross-section of memory cell array 101 including NAND memory string 108, according to some aspects of the present disclosure. As shown in FIG. 2, NAND memory string 108 can extend vertically through a memory stack 204 above a substrate 202. Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 204 can include interleaved gate conductive layers 206 and gate-to-gate dielectric layers 208. The number of the pairs of gate conductive layers 206 and gate-to-gate dielectric layers 208 in memory stack 204 can determine the number of memory cells 106 in memory cell array 101. Gate conductive layer 206 can include conductive materials including, but not limited to, tungsten (W), cobalt (Co), copper (Cu), aluminum (Al), polysilicon, doped silicon, silicides, or any combination thereof. In some implementations, each gate conductive layer 206 includes a metal layer, such as a tungsten layer. In some implementations, each gate conductive layer 206 includes a doped polysilicon layer. Each gate conductive layer 206 can include control gates surrounding memory cells 106, the gates of DSG transistors 112, or the gates of SSG transistors 110, and can extend laterally as DSG line 113 at the top of memory stack 204, SSG line 115 at the bottom of memory stack 204, or word line 118 between DSG line 113 and SSG line 115.

As shown in FIG. 2, NAND memory string 108 includes a channel structure extending vertically through memory stack 204. In some implementations, the channel structure includes a channel hole filled with semiconductor material(s) (e.g., as a semiconductor channel) and dielectric material(s) (e.g., as a memory film). It is understood that although not shown in FIG. 2, additional components of memory cell array 101 can be formed including, but not limited to, gate line slits/source contacts, local contacts, interconnect layers, etc.

Figure 3:
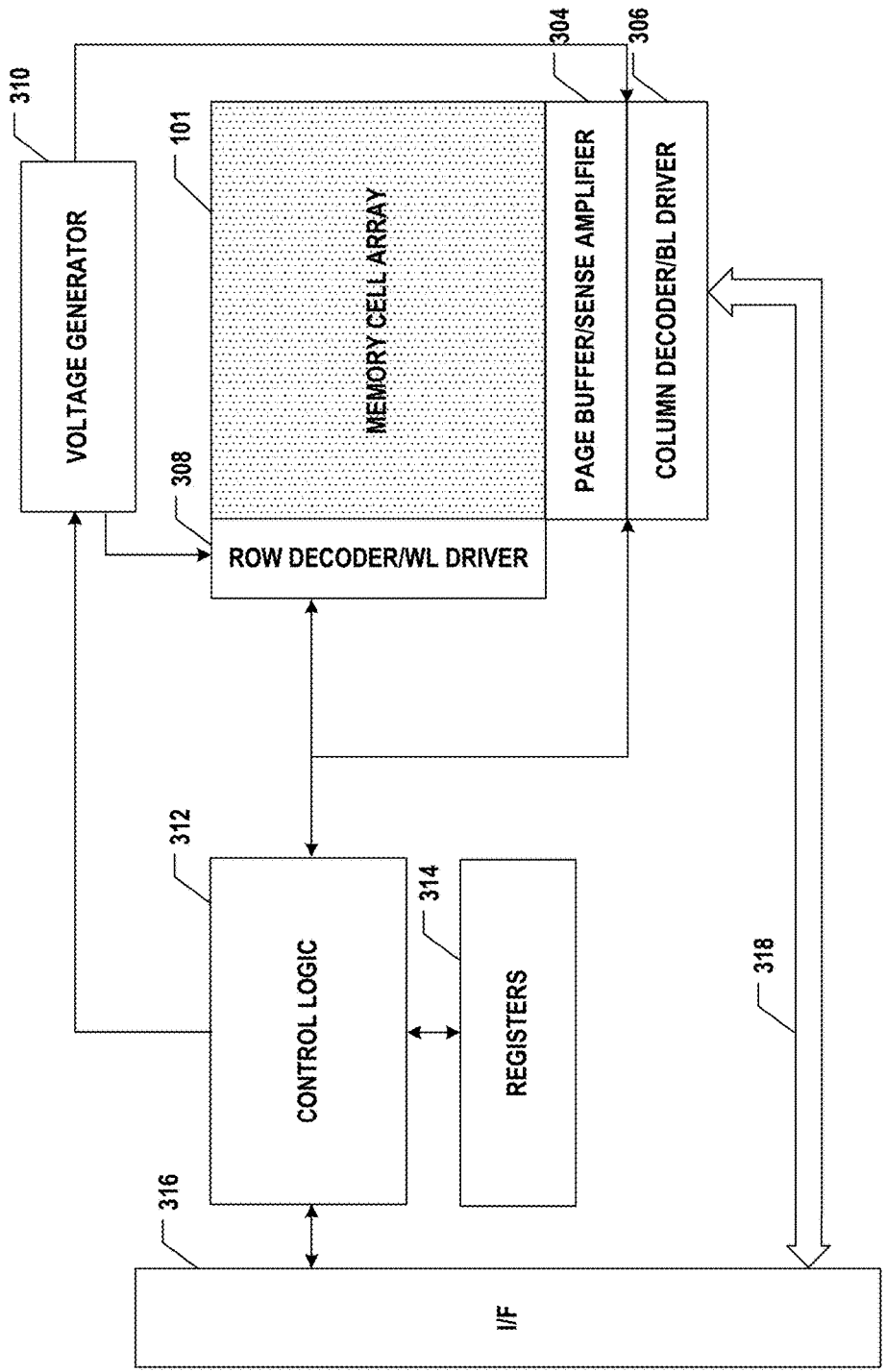
FIG. 3 illustrates a block diagram of a memory device including a memory cell array and peripheral circuits, according to some aspects of the present disclosure.

Referring back to FIG. 1, peripheral circuits 102 can be coupled to memory cell array 101 through bit lines 116, word lines 118, source lines 114, SSG lines 115, and DSG lines 113. Peripheral circuits 102 can include any suitable analog, digital, and mixed-signal circuits for facilitating the operations of memory cell array 101 by applying and sensing voltage signals and/or current signals to and from each select memory cell 106 through bit lines 116, word lines 118, source lines 114, SSG lines 115, and DSG lines 113. Peripheral circuits 102 can include various types of peripheral circuits formed using metal-oxide-semiconductor (MOS) technologies. For example, FIG. 3 illustrates some exemplary peripheral circuits including a page buffer/sense amplifier 304, a column decoder/bit line driver 306, a row decoder/word line driver 308, a voltage generator 310, control logic 312, registers 314, an interface (I/F) 316, and a data bus 318. It is understood that in some examples, additional peripheral circuits not shown in FIG. 3 may be included as well.

Page buffer/sense amplifier 304 can be configured to sense (read) and program (write) data from and to memory cell array 101 according to the control signals from control logic 312. In one example, page buffer/sense amplifier 304 may store one page of program data (write data, referred to herein as "data page") to be programmed into one page 120 of memory cell array 101. In another example, page buffer/sense amplifier 304 may verify programmed select memory cells 106 in each program/verify cycle in a program operation to ensure that the data has been properly programmed into memory cells 106 coupled to select word lines 118. In still another example, page buffer/sense amplifier 304 may also sense the low power signals from bit line 116 that represents a data bit stored in memory cell 106 and amplify the small voltage swing to recognizable logic levels in a read operation. As described below in detail, in program operations, page buffer/sense amplifier 304 can include modules for recording and counting the number of memory cells 106 that fail to pass the verification, i.e., the number of failed memory cells (a.k.a., fail bits), in a program/verify cycle.

Column decoder/bit line driver 306 can be configured to be controlled by control logic 312 and select one or more NAND memory strings 108 by applying bit line voltages generated from voltage generator 310. Row decoder/word line driver 308 can be configured to be controlled by control logic 312 and select/deselect blocks 104 of memory cell array 101 and select/deselect word lines 118 of block 104. Row decoder/word line driver 308 can be further configured to drive word lines 118 using word line voltages generated from voltage generator 310. In some implementations, row decoder/word line driver 308 can also select/deselect and drive SSG lines 115 and DSG lines 113 as well. Voltage generator 310 can be configured to be controlled by control logic 312 and generate the word line voltages (e.g., read voltage, program voltage, channel pass voltage, local voltage, verify voltage, etc.), bit line voltages, and source line voltages to be supplied to memory cell array 101.

Control logic 312 can be coupled to each peripheral circuit described above and configured to control the operations of each peripheral circuit. As described below in detail and consistent with the scope of the present disclosure, in program operations, control logic 312 can include modules for performing VFC based on the number of failed memory cells and a VFC criterion that is adaptive to its VFC capability.

Registers 314 can be coupled to control logic 312 and include status registers, command registers, and address registers for storing status information, command operation codes (OP codes), and command addresses for controlling the operations of each peripheral circuit. Interface 316 can be coupled to control logic 312 and act as a control buffer to buffer and relay control commands received from a memory controller (not shown) and/or a host (not shown) to control logic 312 and status information received from control logic 312 to the memory controller and/or the host. Interface 316 can also be coupled to column decoder/bit line driver 306 via data bus 318 and act as a data input/output (I/O) interface and a data buffer to buffer and relay the data to and from memory cell array 101.

Figure 4:
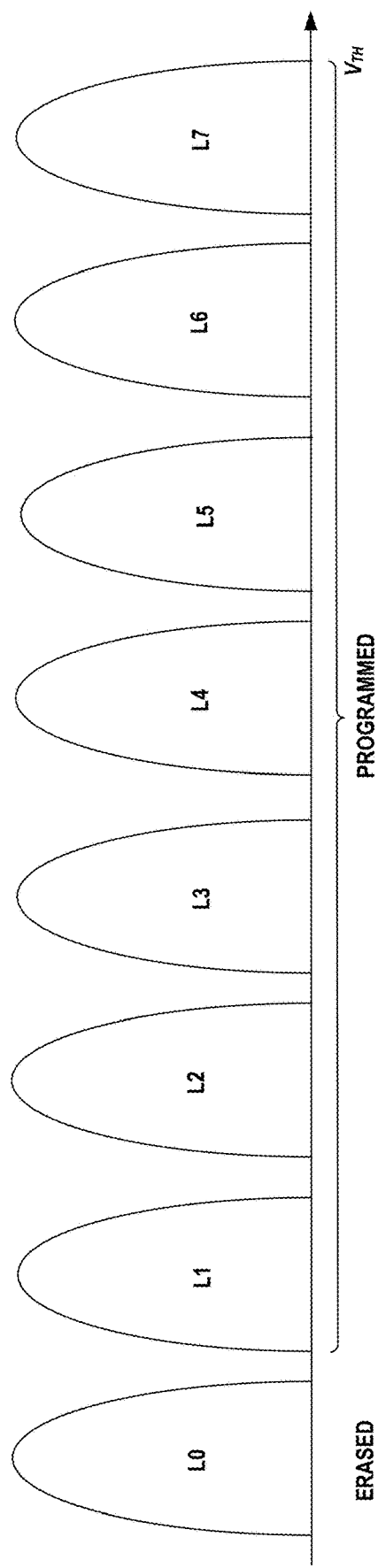
FIG. 4 illustrates threshold voltage distributions of memory cells in a program operation, according to some aspects of the present disclosure.

FIG. 4 illustrates threshold voltage distributions of memory cells in a program operation, according to some aspects of the present disclosure. In some implementations, each memory cell 106 can be set to one of $2^N$ levels corresponding to a piece of N-bits data, where N is an integer greater than 1 (e.g., N=2 for MLCs, N=3 for TLCs, N=4 for QLCs, etc.). Each level can correspond to one of 2 threshold voltage (Vth) ranges of memory cells 106. Taking TLCs, where N=3, for example, as shown in FIG. 4, memory cell 106 may be programmed into one of the 8 levels (L0-L7), including one level of the erased state (L0) and 7 levels of the programmed states (L1-L7). Each level may correspond to a respective threshold voltage (Vth) range of memory cells 106. For example, the level corresponding to the lowest threshold voltage range (the left-most threshold voltage distribution in FIG. 4) may be considered as level 0 (L0), the level corresponding to the second-lowest threshold voltage range (the second left-most threshold voltage distribution in FIG. 4) may be considered as level 1 (L1), and so until level 7 (L7) corresponding to the highest threshold voltage range (the right-most threshold voltage distribution in FIG. 4). As described herein, the last level of the $2^N$ levels refers to level ($2^N$), such as level 3 (L3) for MLCs, level 7 (L7) for TCLs, and level 15 (L15) for QLCs, which is also referred to herein as level K (Lk), where K=$2^N$−1. On the other hand, each level can correspond to one of the 2 pieces of N-bits data that is to be stored in select memory cell 106. In some implementations, the 2 pieces of N-bits data may be mapped to the $2^N$ levels based on a Gray code. A Gray code (a.k.a., reflected binary code (RBC) or reflected binary (RB)) is an ordering of the binary numeral system such that two successive values differ in only one bit (binary digit).

To perform a program operation, in addition to page buffer/sense amplifier 304 providing to each select memory cell 106 the corresponding piece of N-bits data, row decoder/word line driver 308 can be configured to apply program voltages and verify voltages to a select word line 118 coupled to a select row of memory cells 106 in one or more program/verify cycles in order to raise the threshold voltage of each select memory cell 106 to a desired level (into a desired range of threshold voltages) based on the corresponding piece of N-bits data. For example, FIGS. 5A and 5B illustrate a waveform of word line voltages applied to a select word line in a program operation, according to some aspects of the present disclosure.

Figure 5A:
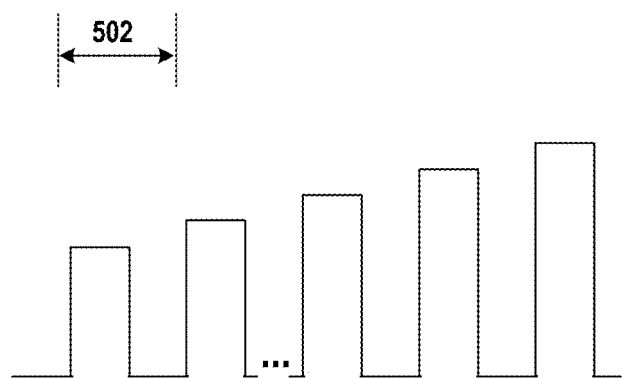
FIGS. 5A and 5B illustrate a waveform of word line voltages applied to a select word line in a program operation, according to some aspects of the present disclosure.
Figure 5B:
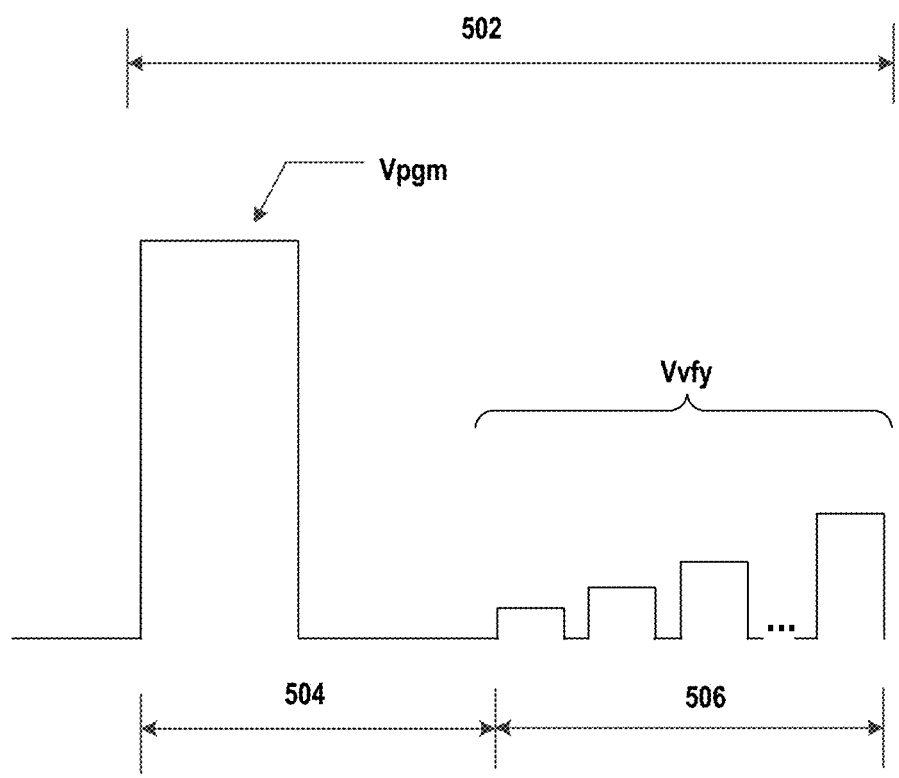

As shown in FIG. 5A, the program operation includes one or more program/verify cycles (a.k.a., loops) 502. As shown in FIG. 5B, in each program/verify cycle 502, row decoder/word line driver 308 can be configured to apply a program voltage (Vpgm) on select word line 118 to select row of memory cells 106 in a program cycle 504 and sequentially apply one or more verify voltages (Vvfy) with incremental changes of voltage levels to verify select row of memory cells 106 in a verify cycle 506. That is, peripheral circuit 102 can perform verification of select row of memory cells 106 at one or more levels in verify cycle 506 after applying a program voltage in program cycle 504. The number of verify voltages applied in verify cycle 506 depends on the level being programmed by the specific program/verify cycle 502, according to some implementations. Taking TLCs, where N=3, for example, during program/verify cycle 502 corresponding to level 6 (L6), two verify voltages (L6 Vvfy and L7 Vvfy) may be applied by peripheral circuit 102 to sequentially verify select memory cells 106 at level 6 (L6) and level 7 (L7); during program/verify cycle 502 corresponding to the last level-level 7 (L7), only one verify voltage (L7 Vvfy) may be applied by peripheral circuit 102 to verify select memory cells 106 at level 7 (L7). As a result, at the end of the program operation, select memory cell 106 can be programmed into one of the $2^N$ levels based on the corresponding N bits of data to be stored in select memory cell 106.

Figure 6A:
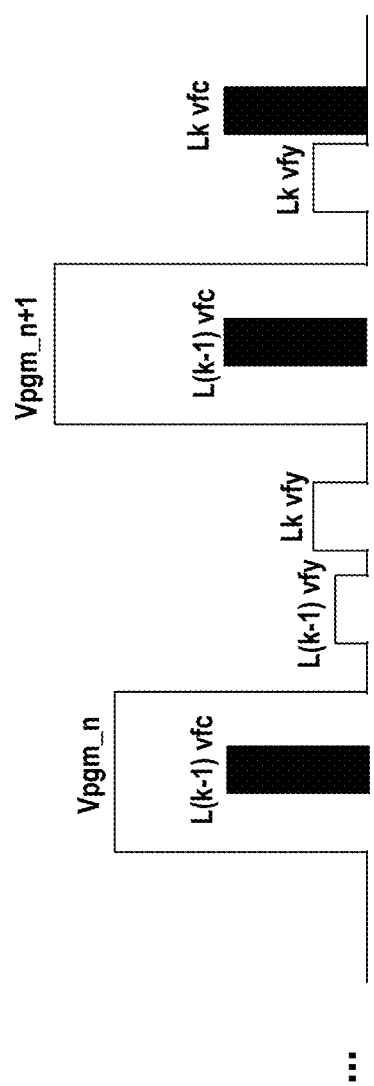
FIGS. 6A and 6B illustrate a normal last-level verify fail count (VFC) scheme in a program operation.
Figure 6B:
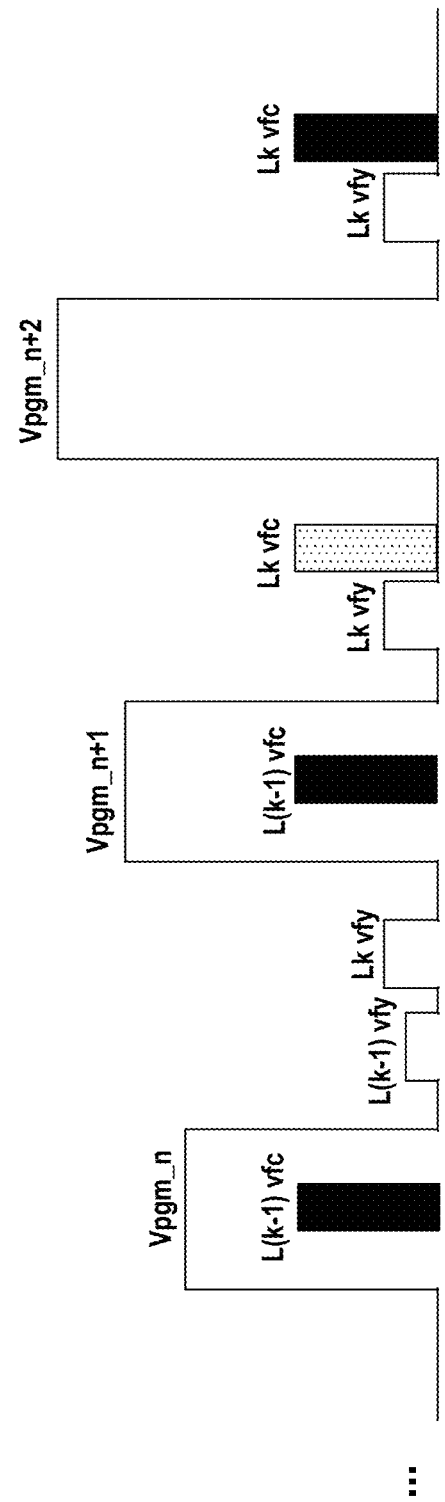

FIGS. 6A and 6B illustrate a normal last-level VFC scheme in a program operation. As shown in FIGS. 6A and 6B, the Nth program voltage (Vpgm_n) is applied on select word line 118 by word line driver 308 of peripheral circuit 102, followed by two verifications (L(k−1) vfy and Lk vfy) corresponding to the last two levels (L(k−1) and L(k)). Then, the (N+1)th program voltage (Vpgm_n+1) greater than the Nth program voltage is applied on select word line 118 by word line driver 308. A second-last level VFC (L(k−1) vfc) is performed by page buffer 304 and control logic 312 of peripheral circuit 102 in parallel with the (N+1)th program voltage, e.g., within a period of applying the (N+1)th program voltage. In response to the second-last level VFC meeting the normal VFC criterion (indicated as a solid box), e.g., the number of select memory cells 106 that fail to pass the second-last level verification (L(k−1) vfy) not exceeding the normal fail bits threshold, the second-last level verification is passed, and only the last-level verification (Lk vfy) needs to be performed after the (N+1)th program voltage.

As shown in FIGS. 6A and 6B, instead of waiting for applying the next (N+2)th program voltage (Vpgm_n+2), the last-level VFC (Lk vfc) is performed after performing the last-level verification and before applying the next (N+2)th program voltage. As shown in FIG. 6A, in response to the last-level VFC meeting the normal VFC criterion (indicated as a solid box), e.g., the number of select memory cells 106 that fail to pass the last-level verification (Lk vfy) not exceeding the normal fail bits threshold, the last-level verification is passed, and the program operation ends without the need of applying the (N+2)th program voltage. In contrast, as shown in FIG. 6B, in response to the last-level VFC not meeting the normal VFC criterion (indicated as a dotted box), e.g., the number of select memory cells 106 that fail to pass the last-level verification (Lk vfy) exceeding the normal fail bits threshold, the last-level verification is failed, and the program operation needs to continue by applying the (N+2)th program voltage (Vpgm_n+2) greater than the (N+1)th program voltage. Again, after applying the (N+2)th program voltage, another last-level verification (Lk vfy) needs to be performed, followed by another last-level VFC (Lk vfc) to determine whether the last-level VFC meets the normal VFC criterion now after applying the (N+2)th program voltage. As shown in FIG. 6B, in response to the 2nd last-level VFC meeting the normal VFC criterion (indicated as a solid box), the 2nd last-level verification is passed, and the program operation ends without the need to apply the (N+3)th program voltage. Otherwise, the (N+3)th program voltage, along with the 3rd last-level verification and 3rd last-level VFC may need to be performed again (not shown), or the program operation may be aborted as failed.

Figure 7A:
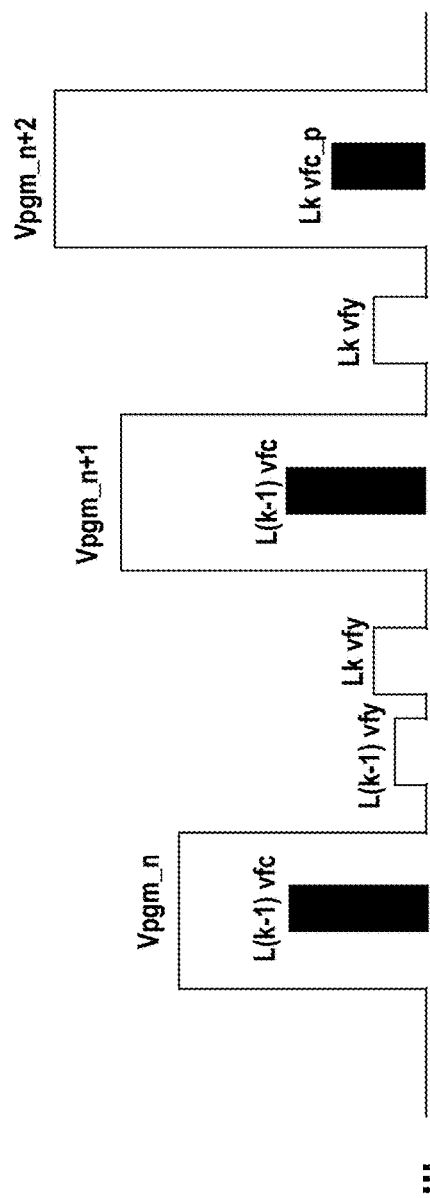
FIGS. 7A and 7B illustrate a predictive last-level VFC scheme in a program operation.
Figure 7B:
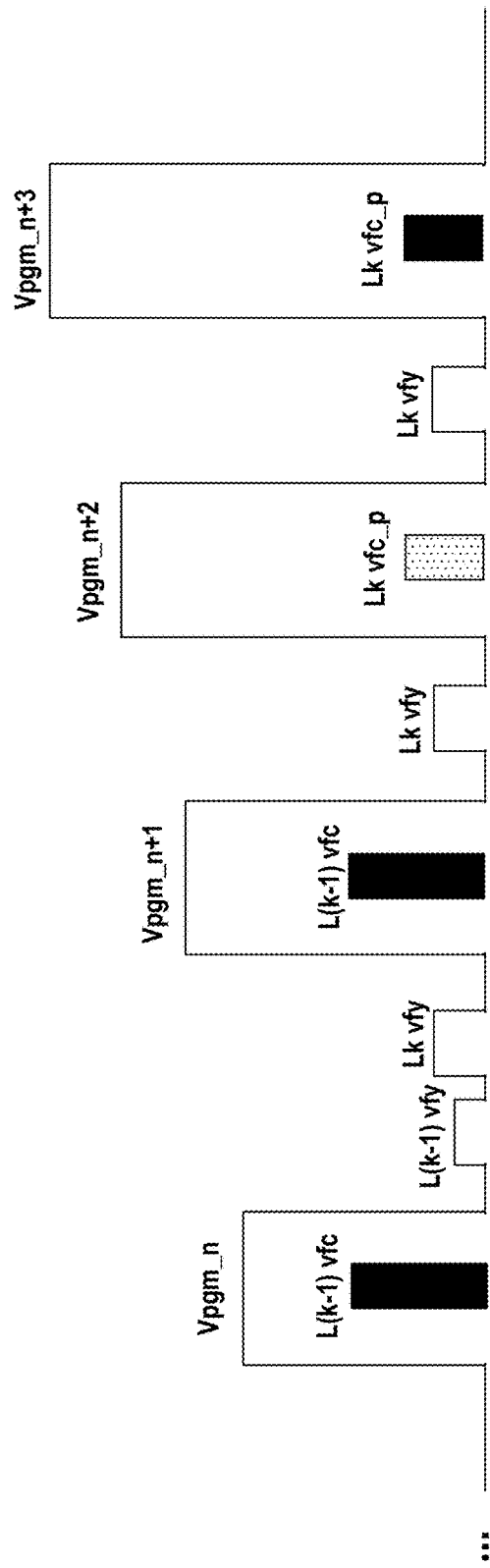

FIGS. 7A and 7B illustrate a predictive last-level VFC scheme in a program operation. As shown in FIGS. 7A and 7B, the Nth program voltage (Vpgm_n) is applied on select word line 118 by word line driver 308 of peripheral circuit 102, followed by two verifications (L(k−1) vfy and Lk vfy) corresponding to the last two levels (L(k−1) and L(k)). Then, the (N+1)th program voltage (Vpgm_n+1) greater than the Nth program voltage is applied on select word line 118 by word line driver 308. A second-last level VFC (L(k−1) vfc) is performed by page buffer 304 and control logic 312 of peripheral circuit 102 in parallel with the (N+1)th program voltage, e.g., within a period of applying the (N+1)th program voltage. In response to the second-last level VFC meeting the normal VFC criterion (indicated as a solid box), e.g., the number of select memory cells 106 that fail to pass the second-last level verification (L(k−1) vfy) not exceeding the normal fail bits threshold, the second-last level verification is passed, and only the last-level verification (Lk vfy) needs to be performed after the (N+1)th program voltage.

Different from the normal last-level VFC scheme in FIGS. 6A and 6B in which the last-level VFC (Lk vfc) is performed with the same normal VFC criterion before applying the next (N+2)th program voltage, for the predictive last-level VFC scheme shown in FIGS. 7A and 7B, the predictive last-level VFC (Lk vfc_p) is performed in parallel with the (N+2)th program voltage (Vpgm_n+2) greater than the (N+1)th program voltage, e.g., within a period of applying the (N+2)th program voltage. Moreover, since an extract, higher program voltage (Vpgm_n+2) has been applied after the first last-level verification, it is reasonable to assume that more select memory cells 106 have passed the last-level verification. Thus, the predictive last-level VFC (Lk vfc_p) is performed with a predictive VFC criterion that is less strict than the normal VFC criterion (e.g., used by the second-last level VFC), e.g., a higher fail bit threshold to pass the last-level VFC, making the last-level VFC more easily to meet the predictive VFC criterion.

As shown in FIG. 7A, in response to the last-level VFC meeting the predictive VFC criterion (indicated as a solid box), e.g., the number of select memory cells 106 that fail to pass the last-level verification (Lk vfy) not exceeding the higher fail bits threshold, the last-level verification is passed, and the program operation ends after applying (N+2)th program voltage without the need of performing the 2nd last-level verification as shown in FIG. 6B. That is, compared with the normal last-level VFC scheme, the predictive last-level VFC scheme may skip the 2nd last-level verification and the 2nd last-level VFC.

However, as shown in FIG. 7B, in response to the last-level VFC not meeting the predictive VFC criterion (indicated as a dotted box), e.g., the number of select memory cells 106 that fail to pass the last-level verification (Lk vfy) still exceeding the higher fail bits threshold, the last-level verification is failed, and the program operation needs to continue by performing another last-level verification (Lk vfy) and applying the (N+3)th program voltage (Vpgm_n+3) greater than the (N+2)th program voltage. Again, another predictive last-level VFC (Lk vfc_p) needs to be performed in parallel with applying the (N+3)th program voltage to determine whether the last-level VFC meets the predictive VFC criterion now after applying the (N+3)th program voltage. As shown in FIG. 7B, in response to the 2nd last-level VFC meeting the predictive VFC criterion (indicated as a solid box), the 2nd last-level verification is passed, and the program operation ends without the need to perform the third last-level verification. Otherwise, the 3rd last-level verification, the 3rd predictive last-level VFC, and the (N+4)th program voltage may need to be performed again (not shown), or the program operation may be aborted as failed.

It is understood that the last-level VFC may not meet the predictive VFC criterion as shown in FIG. 7B due to various reasons, such as the VFC capability of peripheral circuit 102 is not sufficient to cover the relaxed predictive VFC criterion (e.g., too many memory cells 106 to be counted) and/or the word line to word line variation (e.g., causing higher numbers of fail bits in certain rows of memory cells 106). Thus, although the predictive last-level VFC scheme may shorten the program operation time in certain situations (e.g., comparing FIG. 7A to FIG. 6B), it may also increase the program operation time in some other situations. Moreover, it is difficult to find an optimal predictive VFC criterion for programming different rows of memory cells 106 due to the word line-to-word line variation as well.

Figure 8A:
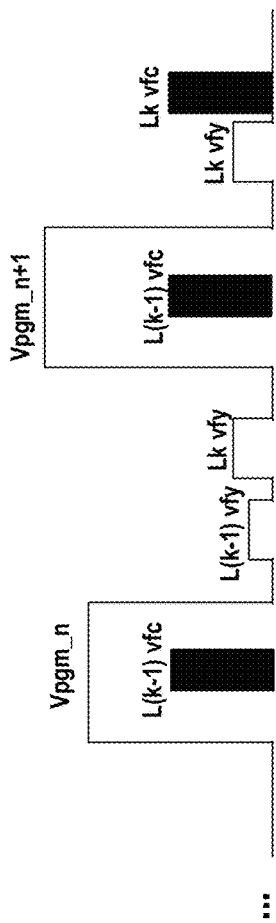
FIGS. 8A-8C illustrate an adaptive last-level VFC scheme in a program operation, according to some aspects of the present disclosure.
Figure 8B:
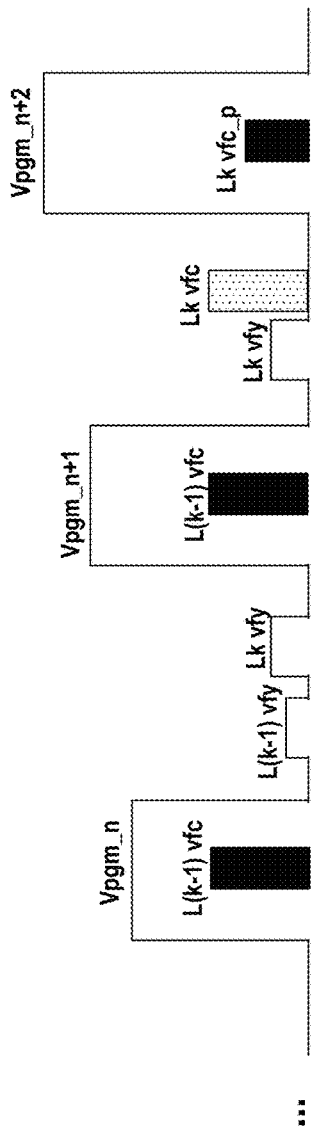
Figure 8C:
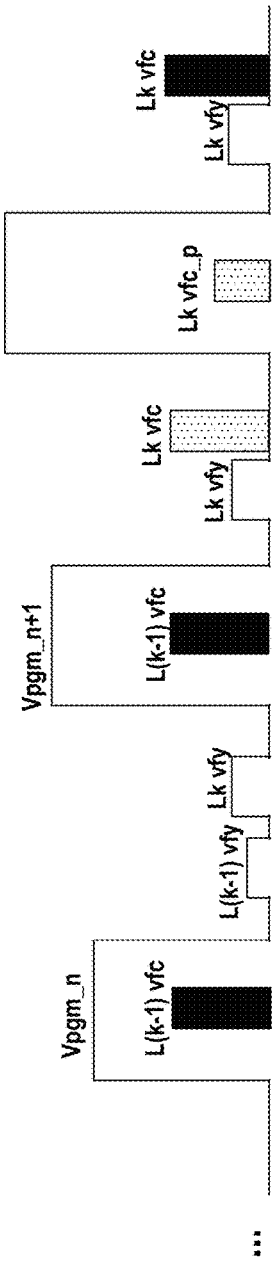
Figure 9:
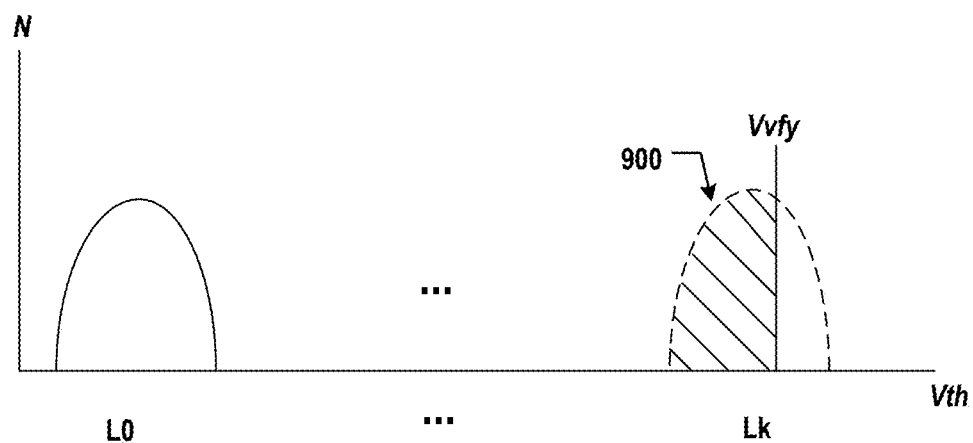
FIG. 9 illustrates threshold voltage distributions of memory cells for a VFC in a program operation, according to some aspects of the present disclosure.

To combine the benefits of both the normal last-level VFC scheme and the predictive last-level VFC scheme described above, consistent with the scope of the present disclosure, FIGS. 8A-8C illustrate an adaptive last-level VFC scheme in a program operation, according to some aspects of the present disclosure. To implement the adaptive last-level VFC scheme, for example, FIG. 10 illustrates a detailed block diagram of peripheral circuit 102 in FIG. 3, including control logic 312, page buffer 304, and word line driver 308, according to some aspects of the present disclosure.

Figure 10:
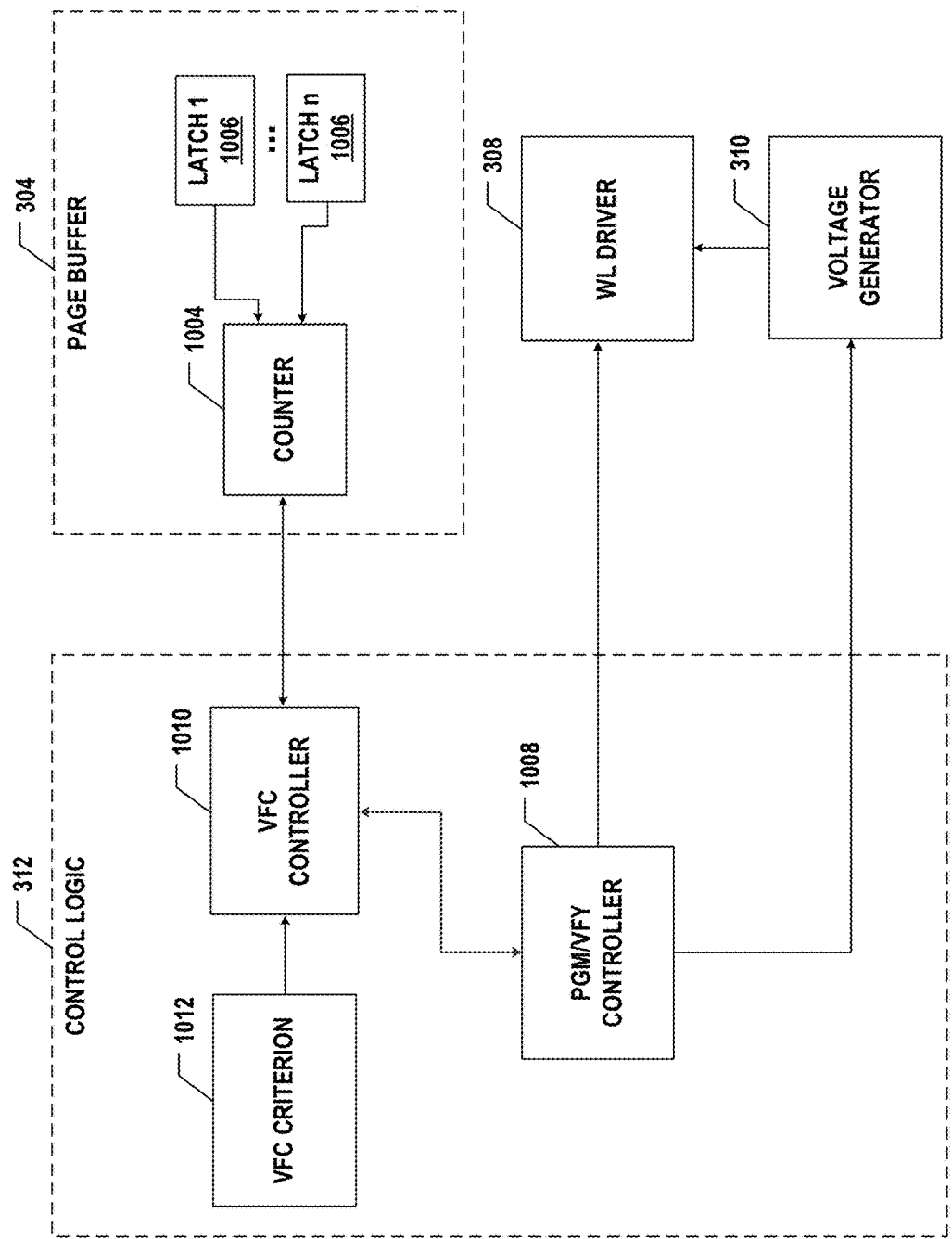
FIG. 10 illustrates a detailed block diagram of the peripheral circuits in FIG. 3, according to some aspects of the present disclosure

As shown in FIGS. 3 and 10, in some implementations, peripheral circuit 102, including control logic 312, row decoder/word line driver 308, voltage generator 310, page buffer/sense amplifier 304, registers 314, and any other suitable components (e.g., column decoder/bit line driver 306) work together to perform a program operation on select memory cells 106 in memory cell array 101 coupled to a select word line 118. To perform the program operation, page buffer 304 can include a counter 1004 and latches 1006, along with any other suitable components not shown in FIG. 10. Counter 1004 and latches 1006 can be a digital circuit, an analog circuit, and/or a mixed-signal circuit, as described below in more detail. To perform the program operation, control logic 312 can include a program/verify controller 1008 and a VFC controller 1010, along with any other suitable components not shown in FIG. 10, such as a processor (e.g., a microcontroller unit (MCU)) and a memory (e.g., random-access memory (RAM)). Each of program/verify controller 1008 and VFC controller 1010 can be implemented as a firmware module stored in the RAM and executed by the MCU. Each of program/verify controller 1008 and VFC controller 1010 can also be implemented as application-specific integrated circuits (ASICs), including a digital circuit, an analog circuit, and/or a mixed-signal circuit.

To perform the program operation, peripheral circuit 102 can be configured to apply program voltages to a row of select memory cells 106 coupled to a select word line 118 and perform verifications of select row of memory cells at various levels after applying the program voltages. In some implementations, as shown in FIG. 10, program/verify controller 1008 of control logic 312 sends commands to voltage generator 310 to control voltage generator 310 to generate a series of program voltages and provide the program voltages to word line driver 308. The voltage levels of the program voltages can be stored in registers 314 and retrieved by control logic 312. Control logic 312 can also send commands to word line driver 308 to control word line driver 308 to apply the program voltages to select word line 118. In some implementations, program/verify controller 1008 of control logic 312 sends commands to voltage generator 310 to control voltage generator 310 to generate a series of verify voltages and provide the verify voltages to word line driver 308. The voltage levels of the verify voltages can correspond to suitable levels to which select memory cells 106 are set. Control logic 312 can also send commands to word line driver 308 to control word line driver 308 to apply one or more verify voltages to select word line 118 after applying each program voltage to select word line 118 to perform the verification.

In some implementations, as shown in FIG. 10, program/verify controller 1008 of control logic 312 also sends commands to page buffer/sense amplifier 304 to check whether the threshold voltage of each programmed select memory cell 106 reaches the verify voltage after word line driver 308 applies the verify voltage. For example, page buffer/sense amplifier 304 may determine whether the threshold voltage of each programmed select memory cell 106 reaches a certain voltage by detecting the current flow through respective bit line 116 coupled to programmed select memory cell 106, i.e., indicating whether the voltage is equal to or greater than the threshold voltage to turn on respective programmed select memory cell 106. That is, page buffer/sense amplifier 304 can be configured to sequentially check whether the threshold voltage of each programmed select memory cell 106 reaches the verify voltage after word line driver 308 applies the verify voltage.

As shown in FIGS. 8A-8C, for example, the Nth program voltage (Vpgm_n), such as a voltage pulse signal, may be applied to select row of memory cells 106 via select word line 118 by word line driver 308 of peripheral circuit 102. The Nth program voltage can be applied to the control gates of each select memory cell 106 to program select memory cells 106. After applying the Nth program voltage, two verifications (L(k−1) vfy and Lk vfy) of select row of memory cells 106 may be performed by peripheral circuit 102 by sequentially applying two verify voltages corresponding to the last two levels (L(k−1) and L(k)), such as two voltage pulse signals, to select word line 118 by word line driver 308. The verify voltage can be applied to the control gates of each select memory cell 106 to compare the threshold voltage of each programmed select memory cells 106 with the verify voltage by checking whether the verify voltage can turn on each programmed select memory cell 106. Then, the (N+1)th program voltage (Vpgm_n+1) greater than the Nth program voltage may be applied on select word line 118 by word line driver 308.

To perform the program operation, peripheral circuit 102 can be configured to perform VFC based on the result of verification and a VFC criterion, for example, whether the result of the verification meets the VFC criterion. In some implementations, as shown in FIG. 10, VFC controller 1010 of control logic 312 sends commands to page buffer 304 to control page buffer 304 to obtain the number of failed memory cells of select row of memory cells 106 that fail to pass the verification (a.k.a., verification-failed memory cell number). In response, latches 1006 of page buffer 304 can record each time that the threshold voltage of a programmed select memory cell is 106 is below the verify voltage (e.g., Vth<Vvfy). Each latch 1006 can be responsible for recording events according to a certain set of conditions. It is understood that in some examples, a single latch 1006 may be used in a time-division multiplexing (TDM) manner to achieve the same function as multiple latches 1006. Counter 1004 of page buffer 304 can be coupled to latches 1006 and count the number of the recorded times, which is the verification-failed memory cell number. As shown in FIG. 10, the shaded area 900, defined by the verify voltage (Vvfy), of the threshold voltage distribution at the last level (Lk) may indicate all programmed select memory cells 106 that fail to pass the verification as their threshold voltages do not reach (smaller than) the verify voltage (e.g., Vth<Vvfy at Lk).

In some implementations, as shown in FIG. 10, VFC controller 1010 of control logic 312 obtains the verification-failed memory cell number from counter 1004 of page buffer 304, as well as a VFC criterion 1012, for example, stored in register 314. In some implementations, VFC controller 1010 then compares the verification-failed memory cell number against the VFC criterion to determine whether the verification is passed or failed. VFC criterion 1012 includes any suitable criteria used to determine whether the result of the verification (e.g., the verification-failed memory cell number) indicates that the verification is passed or failed, according to some implementations. For example, VFC criterion 1012 may be a fail bits threshold, which indicates the maximum verification-failed memory cell number that passes the verification. As described herein, VFC criterion 1012 can include a normal VFC criterion and a predictive VFC criterion that is less strict than the normal VFC criterion, i.e., a relaxed VFC criterion. The predictive VFC criterion is used for the last-level VFC, while the normal VFC criterion is used for VFCs of other levels, according to some implementations. For example, a normal VFC criterion may be a first fail bits threshold, and a predictive VFC criterion may be a second fail bits threshold higher than the first fail bits threshold.

As shown in FIGS. 8A-8C, for example, a second-last level VFC (L(k-1) vfc) may be performed by page buffer 304 and control logic 312 of peripheral circuit 102 in parallel with the (N+1)th program voltage, e.g., within a period of applying the (N+1)th program voltage. In response to the second-last level VFC meeting the normal VFC criterion (indicated as a solid box), e.g., the number of select memory cells 106 that fail to pass the second-last level verification (L(k-1) vfy) not exceeding the normal fail bits threshold, the second-last level verification is passed, and only the last-level verification (Lk vfy) needs to be performed after the (N+1)th program voltage.

As shown in FIGS. 8A-8C, for example, the last-level verification (Lk vfy) may be performed by word line driver 308 and page buffer 304 of peripheral circuit 102. After applying the (N+1)th program voltage and performing the second-last level VFC, one verification (Lk vfy) of select row of memory cells 106 at the last level (Lk) may be performed by peripheral circuit 102 by applying a verify voltage corresponding to the last level, such as a voltage pulse signal, to select word line 118 by word line driver 308. The verify voltage can be applied to the control gates of each select memory cell 106 to compare the threshold voltage of each programmed select memory cells 106 with the verify voltage by checking whether the verify voltage can turn on each programmed select memory cell 106.

As shown in FIGS. 8A-8C, for example, instead of waiting for applying the next (N+2)th program voltage (Vpgm_n+2), a normal last-level VFC (Lk vfc) may be performed by page buffer 304 and control logic 312 of peripheral circuit 102 after performing the last-level verification and before applying the (N+2)th program voltage. As shown in FIG. 8A, in response to the normal last-level VFC meeting the normal VFC criterion (indicated as a solid box), e.g., the number of select memory cells 106 that fail to pass the last-level verification not exceeding the normal fail bits threshold, the last-level verification is passed, and the program operation may end without the need of applying the (N+2)th program voltage. In this case, the adaptive last-level VFC scheme adopts the normal last-level VFC scheme (comparing FIG. 8A and FIG. 6A), which shortens the program operation time by eliminating the (N+2)th program voltage, according to some implementations.

In contrast, as shown in FIGS. 8B and 8C, in response to the normal last-level VFC not meeting the normal VFC criterion (indicated as a dotted box), e.g., the number of select memory cells 106 that fail to pass the last-level verification exceeding the normal fail bits threshold, the last-level verification is failed, and the program operation may need to continue by applying the (N+2)th program voltage (Vpgm_n+2) greater than the (N+1)th program voltage.

As shown in FIGS. 8B and 8C, for example, a predictive last-level VFC (Lk vfc_p) may be performed by page buffer 304 and control logic 312 of peripheral circuit 102 in parallel with the (N+2)th program voltage, e.g., within a period of applying the (N+2)th program voltage. Moreover, since an extract, higher program voltage (Vpgm_n+2) has been applied after the first last-level verification, it is reasonable to assume that more select memory cells 106 have passed the last-level verification. Thus, the predictive last-level VFC (Lk vfc_p) is performed with a predictive VFC criterion that is less strict than the normal VFC criterion (e.g., used by the normal last-level VFC), e.g., a higher fail bit threshold to pass the last-level VFC, making the last-level VFC more easily to meet the predictive VFC criterion.

As shown in FIG. 8B, in response to the predictive last-level VFC meeting the predictive VFC criterion (indicated as a solid box), e.g., the number of select memory cells 106 that fail to pass the last-level verification (Lk vfy) not exceeding the higher fail bits threshold, the last-level verification is passed, and the program operation ends after applying (N+2)th program voltage without the need of performing the 2nd last-level verification again. In this case, the adaptive last-level VFC scheme adopts the predictive last-level VFC scheme (comparing FIG. 8B and FIG. 7A), which shortens the program operation time by eliminating the 2nd last-level verification (e.g., in FIG. 6B), according to some implementations.

In contrast, as shown in FIG. 8C, in response to the predictive last-level VFC not meeting the predictive VFC criterion (indicated as a dotted box), e.g., the number of select memory cells 106 that fail to pass the last-level verification (Lk vfy) still exceeding the higher fail bits threshold, the last-level verification is failed again, and the program operation needs to continue by performing still another last-level verification (Lk vfy). However, instead of waiting for applying the next (N+3)th program voltage (Vpgm_n+3, as shown in FIG. 7B of the predictive last-level VFC scheme), another normal last-level VFC (Lk vfc) may be performed by page buffer 304 and control logic 312 of peripheral circuit 102 after performing the 2nd last-level verification and before applying the (N+3)th program voltage. Similar to the 1st normal last-level VFC, the 2nd normal last-level VFC may be performed by comparing the result of the 2nd last-level verification against a normal VFC criterion. For example, the two normal VFC criteria used by the 1st and 2nd normal last-level VFCs may be the same.

As shown in FIG. 8C, in response to the 2nd normal last-level VFC meeting the normal VFC criterion (indicated as a solid box), the 2nd last-level verification is passed, and the program operation ends without the need of applying the next (N+3)th program voltage. Otherwise, the (N+3)th program voltage may need to be applied, and the 2nd predictive last-level VFC may need to be performed in parallel with the N+3)th program voltage (not shown), or the program operation may be aborted as being failed. In this case, the adaptive last-level VFC scheme adopts the normal last-level VFC scheme, which shortens the program operation time by eliminating the (N+3)th program voltage (e.g., in FIG. 7B), according to some implementations.

As shown in FIGS. 8A-8C, the normal last-level VFCs (Lk vfc) between verification and applying of program voltage and the predictive last-level VFCs (Lk vfc_p) in parallel with applying of program voltage can be performed alternately according to the adaptive last-level VFC scheme in order to end the program operation as soon as the verification is passed. Different from the normal last-level VFC scheme that always ends the program operations after the verification (e.g., in FIGS. 6A and 6B) and the predictive last-level VFC schemes that always end the program operations after applying the program voltage (e.g., in FIGS. 7A and 7B), the adaptive last-level VFC scheme disclosed herein can flexibility end the program operations by switching between the normal last-level VFC scheme and the predictive last-level VFC scheme.

Figure 11:
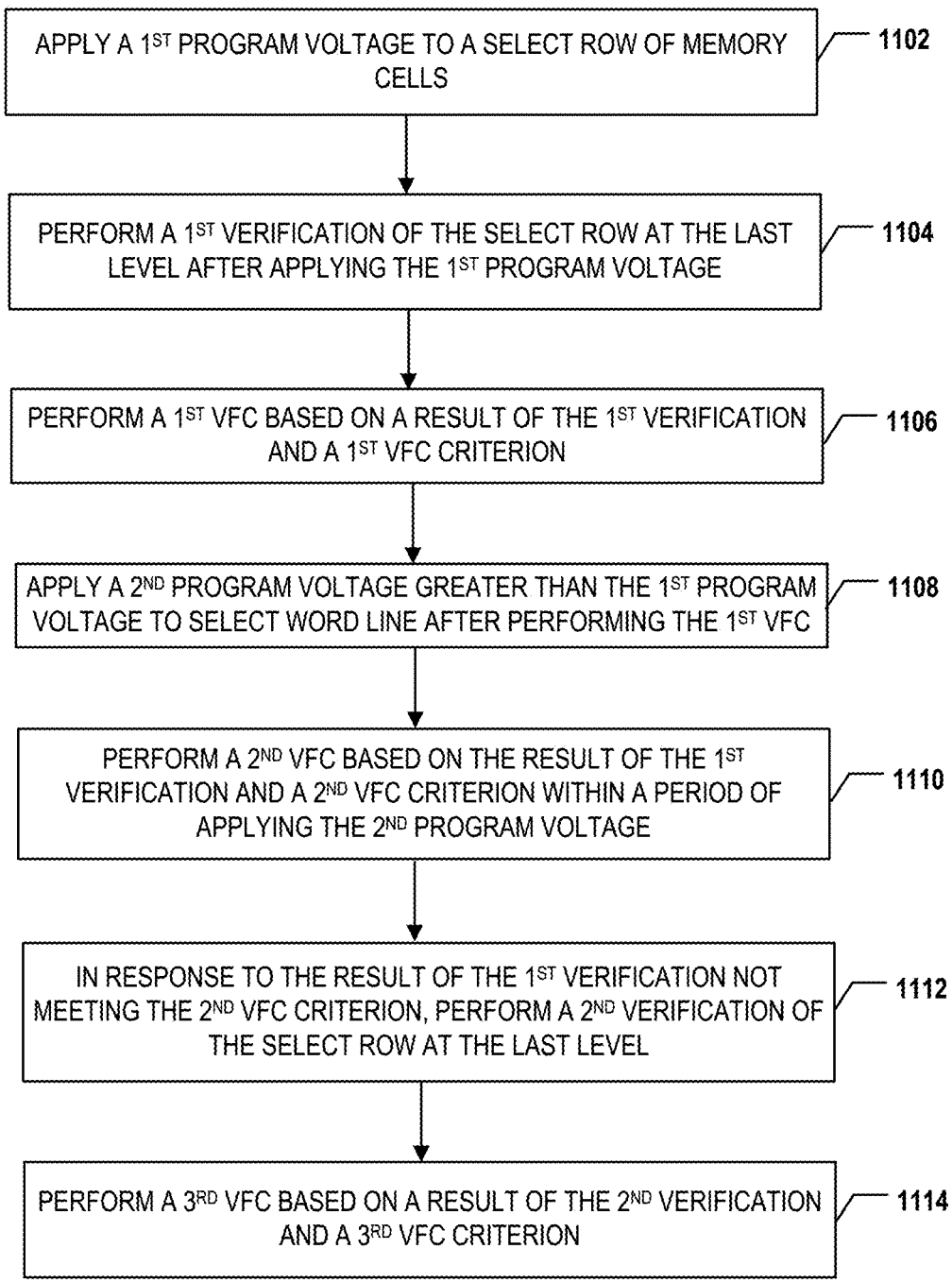
FIG. 11 illustrates a flowchart of a method for programming a memory device, according to some aspects of the present disclosure.

FIG. 11 illustrates a flowchart of a method 1100 for programming a memory device, according to some aspects of the present disclosure. The memory device may be any suitable memory device disclosed herein, such as memory device 100. Method 1100 may be implemented by peripheral circuit 102, such as row decoder/word line driver 308, page buffer/sense amplifier 304, and control logic 312. It is understood that the operations shown in method 1100 may not be exhaustive and that other operations can be performed as well before, after, or between any of the illustrated operations. Further, some of the operations may be performed simultaneously, or in a different order than shown in FIG. 11.

Referring to FIG. 11, method 1100 starts at operation 1102, in which a first program voltage is applied to a select row of the rows of the memory cells. At least one of the memory cells is set to one of $2^N$ levels corresponding to a piece of N-bits data, where N is an integer greater than 1. For example, as shown in FIGS. 8A-8C and 10, in a program operation, the (N+1)th program voltage (Vpgm_n+1, "a first program voltage") may be applied to select row of memory cells 106 via select word line 118 by word line driver 308 of peripheral circuit 102.

Method 1100 proceeds to operation 1104, as illustrated in FIG. 11, in which a first verification of the select row is performed at a last level of the $2^N$ levels after applying the first program voltage. In some implementations, to perform the first verification, a verify voltage corresponding to the last level of the $2^N$ levels is applied to the select row. For example, as shown in FIGS. 8A-8C and 10, in the program operation, the 1st last-level verification (Lk vfy, "a first verification at a last level of the $2^N$ levels") may be performed after applying the (N+1)th program voltage by word line driver 308 and page buffer 304 of peripheral circuit 102.

Method 1100 proceeds to operation 1106, as illustrated in FIG. 11, in which a first VFC is performed based on a result of the first verification and a first VFC criterion. In some implementations, to perform the first VFC, a number of failed memory cells of the select row that fail to pass the first verification is obtained, and the number of the failed memory cells is compared against the first VFC criterion. In some implementations, the first verification is passed when the result of the first verification meets the first VFC criterion; the first verification is failed when the result of the first verification does not meet the first VFC criterion. For example, as shown in FIGS. 8A-8C and 10, in the program operation, the 1st normal last-level VFC (Lk vfc, "a first VFC") may be performed based on the result of the 1st last-level verification and the normal VFC criterion ("a first VFC criterion") after the 1st last-level verification but before applying the next (N+2)th program voltage by page buffer 304 and control logic 312 of peripheral circuit 102. In one example, the verification-failed memory cell number of the 1st last-level verification may be recorded and counted by latches 1006 and counter 1004 of page buffer 304, respectively, and then be compared against a default VFC criterion 1012 to determine whether the 1st last-level verification is passed or failed by VFC controller 1010 of control logic 312.

Method 1100 proceeds to operation 1108, as illustrated in FIG. 11, in which a second program voltage greater than the first program voltage is applied to the select row after performing the first VFC. The second program voltage can be applied in response to the result of the first verification not meeting the first VFC criterion. Otherwise, the second program voltage can be skipped to end the program operation. For example, as shown in FIGS. 8B, 8C and 10, in the program operation, the (N+2)th program voltage (Vpgm_n+2, "a second program voltage") greater than the (N+1)th program voltage may be applied to select row of memory cells 106 via select word line 118 by word line driver 308 of peripheral circuit 102 after performing the 1st normal last-level VFC when the result of the 1st last-level verification does not meet the normal VFC criterion (indicated as a dotted box, i.e., the 1st last-level verification is failed). Otherwise, as shown in FIGS. 8A and 10, in the program operation, the (N+2)th program voltage may be skipped after performing the 1st normal last-level VFC to end the program operation when the result of the 1st last-level verification meets the normal VFC criterion (indicated as a solid box. i.e., the 1st last-level verification is passed).

Method 1100 proceeds to operation 1110, as illustrated in FIG. 11, in which a second VFC is applied based on the result of the first verification and a second VFC criterion different from the first VFC criterion within a period of applying the second program voltage. The second VFC criterion can be less strict than the first VFC criterion. For example, as shown in FIGS. 8B, 8C, and 10, in the program operation, the 1st predictive last-level VFC (Lk vfc_p, "a second VFC") may be performed based on the result of the 1st last-level verification and the predictive VFC criterion ("a second VFC criterion") within the period of applying the (N+2)th program voltage by page buffer 304 and control logic 312 of peripheral circuit 102. The predictive VFC criterion may be less strict than the normal VFC criterion, for example, having a higher fail bits threshold. In one example, the verification-failed memory cell number of the 1st last-level verification may be recorded and counted by latches 1006 and counter 1004 of page buffer 304, respectively, and then be compared against a relaxed VFC criterion 1012 to determine whether the 1 st last-level verification is passed or failed by VFC controller 1010 of control logic 312.

Method 1100 proceeds to operation 1112, as illustrated in FIG. 11, in which a second verification of the select row is performed at the last level in response to the result of the first verification not meeting the second VFC criterion. For example, as shown in FIGS. 8C and 10, in the program operation, the 2nd last-level verification (Lk vfy, "a second verification at the last level) may be performed after applying the (N+2)th program voltage by word line driver 308 and page buffer 304 of peripheral circuit 102 when the result of the 1st last-level verification does not meet the predictive VFC criterion (indicated as a dotted box, i.e., the 1st last-level verification is failed again under the relaxed VFC criterion after applying the (N+2)th program voltage).

Method 1100 proceeds to operation 1114, as illustrated in FIG. 11, in which a third VFC is performed based on a result of the second verification and a third VFC criterion. In some implementations, the third VFC criterion is the same as the first VFC criterion. For example, as shown in FIGS. 8C and 10, in the program operation, the 2nd normal last-level VFC (Lk vfc, "a third VFC") may be performed based on the result of the 2nd last-level verification and the normal VFC criterion ("a third VFC criterion") after the 2nd last-level verification but before applying the next (N+3)th program voltage by page buffer 304 and control logic 312 of peripheral circuit 102. The normal VFC criteria may be the same for the 1st and 2nd normal last-level VFCs. In one example, the verification-failed memory cell number of the 2nd last-level verification may be recorded and counted by latches 1006 and counter 1004 of page buffer 304, respectively, and then be compared against default VFC criterion 1012 to determine whether the 1st last-level verification is passed or failed by VFC controller 1010 of control logic 312.

In some implementations, in response to the result of the first verification meeting the second VFC criterion, the second verification and the third VFC are skipped. For example, as shown in FIGS. 8B and 10, in the program operation, the 2nd last-level verification and the 2nd normal last-level VFC may be skipped after performing the 1st predictive last-level VFC to end the program operation when the result of the 1st last-level verification meets the predictive VFC criterion (indicated as a solid box. i.e., the 1st last-level verification is passed under the relaxed VFC criterion after applying the (N+2)th program voltage).

Figure 12:
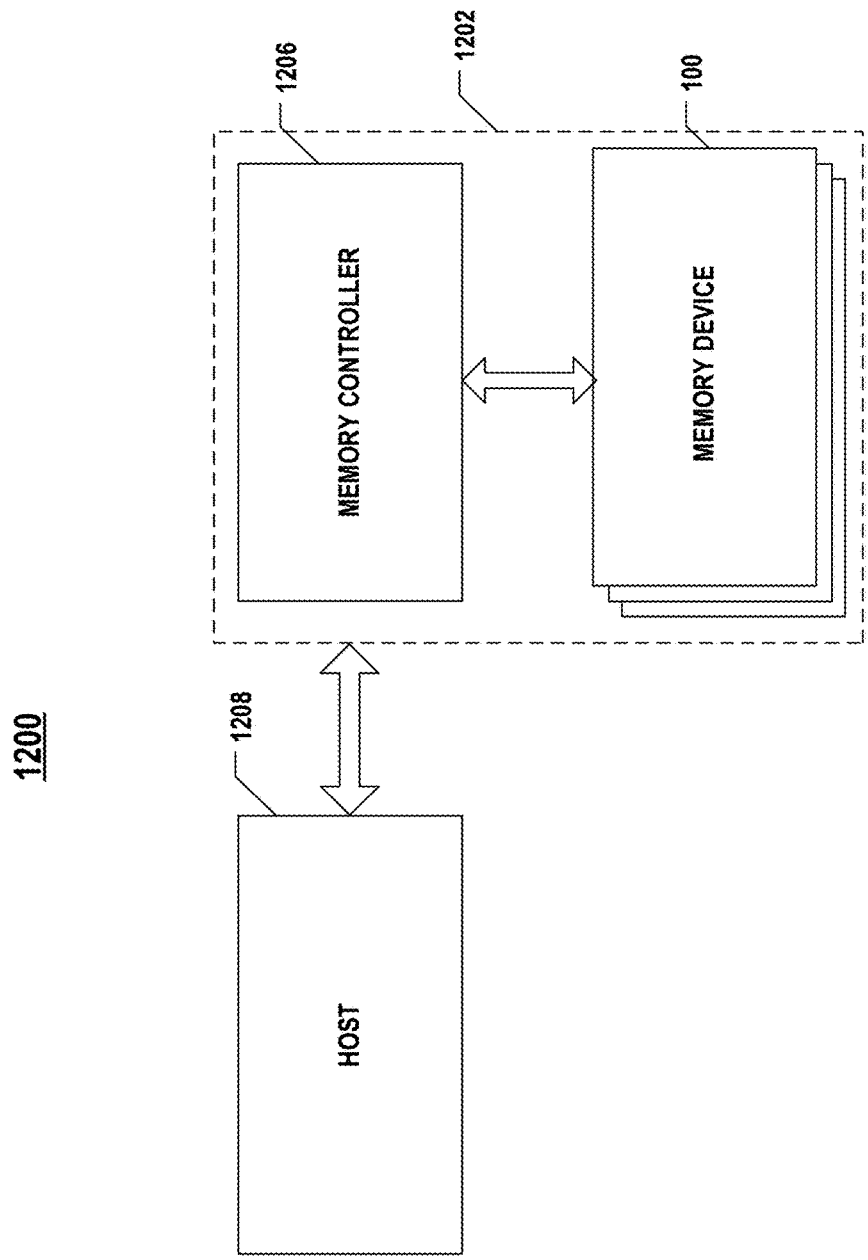
FIG. 12 illustrates a block diagram of a system having a memory device, according to some aspects of the present disclosure.

FIG. 12 illustrates a block diagram of a system 1200 having a memory device, according to some aspects of the present disclosure. System 1200 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 12, system 1200 can include a host 1208 and a memory system 1202 having one or more memory devices 100 (shown in FIG. 1) and a memory controller 1206. Host 1208 can be a processor of an electronic device, such as a central processing unit (CPU), or a system-on-chip (SoC), such as an application processor (AP). Host 1208 can be configured to send or receive data to or from memory devices 100.

Memory device 100 can be any memory device disclosed in the present disclosure. Memory controller 1206 is coupled to memory device 100 and host 1208 and is configured to control memory device 100, according to some implementations. Memory controller 1206 can manage the data stored in memory device 100 and communicate with host 1208. In some implementations, memory controller 1206 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1206 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1206 can be configured to control operations of memory device 100, such as read, erase, and program operations. Memory controller 1206 can also be configured to manage various functions with respect to the data stored or to be stored in memory device 100 including, but not limited to bad-block management, garbage collection, logical-to-physical address conversion, wear leveling, etc. In some implementations, memory controller 1206 is further configured to process error correction codes (ECCs) with respect to the data read from or written to memory device 100. Any other suitable functions may be performed by memory controller 1206 as well, for example, formatting memory device 100. Memory controller 1206 can communicate with an external device (e.g., host 1208) according to a particular communication protocol. For example, memory controller 1206 may communicate with the external device through at least one of various interface protocols, such as a USB protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 13A:
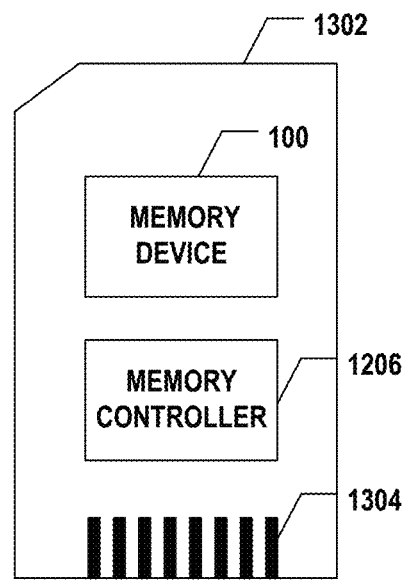
FIG. 13A illustrates a diagram of a memory card having a memory device, according to some aspects of the present disclosure.
Figure 13B:
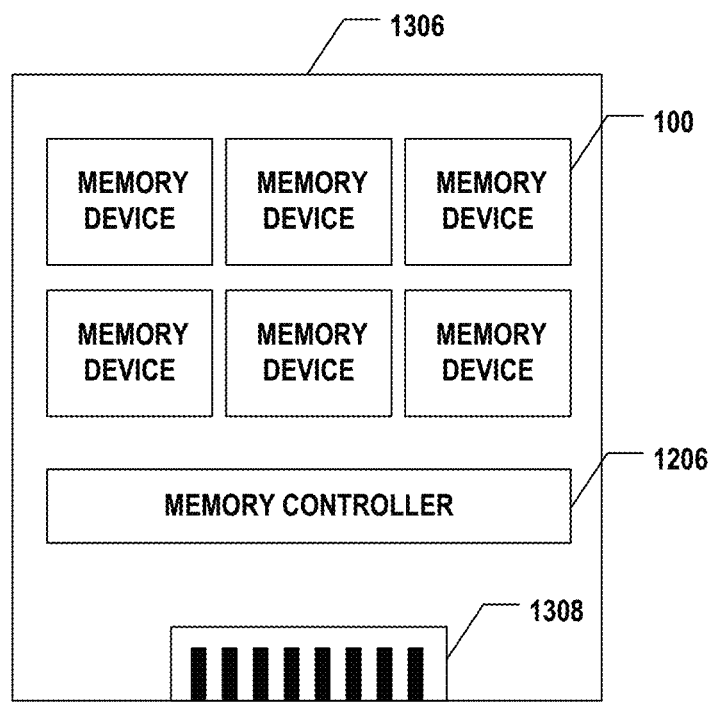
FIG. 13B illustrates a diagram of a solid-state drive (SSD) having a memory device, according to some aspects of the present disclosure.

Memory controller 1206 and one or more memory devices 100 can be integrated into various types of storage devices, for example, being included in the same package, such as a universal Flash storage (UFS) package or an eMMC package. That is, memory system 1202 can be implemented and packaged into different types of end electronic products. In one example as shown in FIG. 13A, memory controller 1206 and a single memory device 100 may be integrated into a memory card 1302. Memory card 1302 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 1302 can further include a memory card connector 1304 coupling memory card 1302 with a host (e.g., host 1208 in FIG. 12). In another example as shown in FIG. 13B, memory controller 1206 and multiple memory devices 100 may be integrated into an SSD 1306. SSD 1306 can further include an SSD connector 1308 coupling SSD 1306 with a host (e.g., host 1208 in FIG. 12). In some implementations, the storage capacity and/or the operation speed of SSD 1306 is greater than those of memory card 1302.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A memory device, comprising:
an array of memory cells, at least one of the memory cells being set to one of $2^N$ levels corresponding to a piece of N-bits data, where N is an integer greater than 1; and
a peripheral circuit coupled to the array of memory cells and configured to:
apply a first program voltage to a select row of the memory cells;
perform a first verification of the select row of the memory cells at a last level of the $2^N$ levels after applying the first program voltage;
perform a first verify fail count (VFC) based on a result of the first verification and a first VFC criterion;
apply a second program voltage greater than the first program voltage to the select row of the memory cells after performing the first VFC; and
perform a second VFC based on the result of the first verification and a second VFC criterion different from the first VFC criterion within a period of applying the second program voltage.

2. The memory device of claim 1, wherein the peripheral circuit is configured to apply the second program voltage in response to the result of the first verification not meeting the first VFC criterion.

3. The memory device of claim 2, wherein the peripheral circuit is further configured to:
in response to the result of the first verification not meeting the second VFC criterion, perform a second verification of the select row of the memory cells at the last level; and
perform a third VFC based on a result of the second verification and a third VFC criterion.

4. The memory device of claim 3, wherein the peripheral circuit is further configured to:
in response to the result of the first verification meeting the second VFC criterion, skip the second verification and the third VFC.

5. The memory device of claim 3, wherein the third VFC criterion is the same as the first VFC criterion.

6. The memory device of claim 1, further comprising:
word lines respectively coupled to rows of the memory cells,
wherein to perform the first verification, the peripheral circuit comprises a word line driver configured to apply a verify voltage to a select word line of the word lines that is coupled to the select row of the memory cells, the verify voltage corresponding to the last level of the $2^N$ levels.

7. The memory device of claim 1, wherein to perform the first VFC, the peripheral circuit comprises:
a page buffer configured to obtain a number of failed memory cells of the select row of the memory cells that fail to pass the first verification; and
control logic configured to compare the number of the failed memory cells against the first VFC criterion.

8. The memory device of claim 1, wherein the second VFC criterion is less strict than the first VFC criterion.

9. A system, comprising:
a memory device configured to store data, the memory device comprising:
an array of memory cells in rows, at least one of the memory cells being set to one of $2^N$ levels corresponding to a piece of N-bits data, where N is an integer greater than 1; and
a peripheral circuit coupled to the array of memory cells and configured to:
apply a first program voltage to a select row of the memory cells;
perform a first verification of the select row of the memory cells at a last level of the $2^N$ levels after applying the first program voltage;
perform a first verify fail count (VFC) based on a result of the first verification and a first VFC criterion;
in response to the result of the first verification not meeting the first VFC criterion, apply a second program voltage greater than the first program voltage to the select row of the memory cells after performing the first VFC; and
perform a second VFC based on the result of the first verification and a second VFC criterion different from the first VFC criterion within a period of applying the second program voltage; and
a memory controller coupled to the memory device and configured to control the memory device.

10. The system of claim 9, wherein the peripheral circuit is further configured to:
in response to the result of the first verification not meeting the second VFC criterion, perform a second verification of the select row of the memory cells at the last level; and
perform a third VFC based on a result of the second verification and a third VFC criterion.

11. The system of claim 10, wherein the peripheral circuit is further configured to:
in response to the result of the first verification meeting the second VFC criterion, skip the second verification and the third VFC.

12. The system of claim 9, wherein to perform the first VFC, the peripheral circuit comprises:
a page buffer configured to obtain a number of failed memory cells of the select row of the memory cells that fail to pass the first verification; and
control logic configured to compare the number of the failed memory cells against the first VFC criterion.

13. The system of claim 9, wherein the second VFC criterion is less strict than the first VFC criterion.

14. A method of programming a memory device, the memory device comprising rows of memory cells, at least one of the memory cells being set to one of $2^N$ levels corresponding to a piece of N-bits data, where N is an integer greater than 1, the method comprising:
applying a first program voltage to a select row of the rows of the memory cells;
performing a first verification of the select row at a last level of the $2^N$ levels after applying the first program voltage;

performing a first verify fail count (VFC) based on a result of the first verification and a first VFC criterion;

applying a second program voltage greater than the first program voltage to the select row after performing the first VFC; and performing a second VFC based on the result of the first verification and a second VFC criterion different from the first VFC criterion within a period of applying the second program voltage.

15. The method of claim 14, wherein the second program voltage is applied in response to the result of the first verification not meeting the first VFC criterion.

16. The method of claim 15, further comprising:

in response to the result of the first verification not meeting the second VFC criterion, performing a second verification of the select row at the last level; and performing a third VFC based on a result of the second verification and a third VFC criterion.

17. The method of claim 16, further comprising:

in response to the result of the first verification meeting the second VFC criterion, skipping the second verification and the third VFC.

18. The method of claim 16, wherein the third VFC criterion is the same as the first VFC criterion.

19. The method of claim 14, wherein performing the first verification comprises applying a verify voltage to the select row, the verify voltage corresponding to the last level of the $2^N$ levels.

20. The method of claim 14, wherein performing the first VFC comprises:

obtaining a number of failed memory cells of the select row that fail to pass the first verification; and comparing the number of failed memory cells against the first VFC criterion.

* * * * *